United States Patent [19]

Moriyama

[11] Patent Number: 4,982,694

[45] Date of Patent: Jan. 8, 1991

[54] AUTOMATIC COATING SYSTEM

[75] Inventor: Masashi Moriyama, Tokorozawa, Japan

[73] Assignee: Tokyo Electron Limited, Tokyo, Japan

[21] Appl. No.: 307,060

[22] Filed: Feb. 7, 1989

[30] Foreign Application Priority Data

Feb. 10, 1988 [JP] Japan .................. 63-29332

[51] Int. Cl.⁵ ........................................... B05C 3/09
[52] U.S. Cl. ................... 118/697; 118/704; 118/52; 118/56; 364/181
[58] Field of Search ............... 118/685, 686, 695, 696, 118/704, 56, 63, 324, 326, 634, 70, 642, 643, 679, 500, 697, 698, 62, 64, 666, 52, 58, 687, 688, 712, 713; 364/181

[56] References Cited

U.S. PATENT DOCUMENTS

| | | | |
|---|---|---|---|
| 1,948,091 | 2/1934 | Alvey et al. | 118/56 |
| 4,286,541 | 9/1981 | Blackwood | 118/63 |
| 4,418,644 | 12/1983 | Young | 118/682 |
| 4,430,959 | 2/1984 | Ebata et al. | 118/697 |
| 4,451,507 | 5/1984 | Beltz et al. | 118/320 |
| 4,505,220 | 3/1985 | Bank et al. | 118/56 |
| 4,590,094 | 5/1986 | Ringer | 118/56 |
| 4,770,121 | 9/1988 | Ebata et a. | 118/704 |
| 4,775,281 | 10/1988 | Prentakis | 118/500 |
| 4,790,262 | 12/1988 | Nakayama et al. | 118/320 |
| 4,807,561 | 2/1989 | Ebata | 118/697 |

FOREIGN PATENT DOCUMENTS

| | | | |
|---|---|---|---|
| 2151037 | 3/1979 | Fed. Rep. of Germany | 118/320 |
| 3732113 | 10/1988 | Fed. Rep. of Germany | 118/320 |
| 53-37189 | 6/1978 | Japan . | |

*Primary Examiner*—Willard Hoag
*Attorney, Agent, or Firm*—Oblon, Spivak, McClelland, Maier & Neustadt

[57] ABSTRACT

An automatic coating system includes a coating apparatus for coating a coating material on an object to be coated in accordance with a coating operation including a plurality of steps, a memory for storing operation programs of a series of steps, a step updating key for inputting a signal for operating the series of steps of the coating apparatus one by one, and a CPU for starting one step of the coating apparatus on the basis of the program when the signal is input. After the one step of the coating apparatus is finished, the next step is not started until the step updating key is operated.

13 Claims, 6 Drawing Sheets

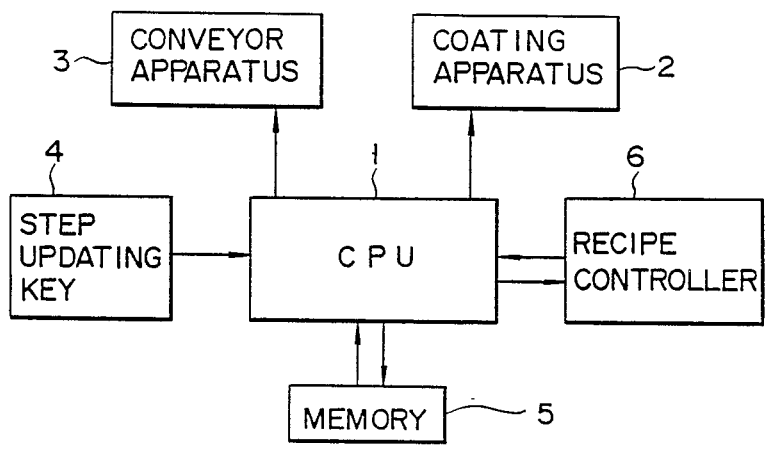
F I G. 1
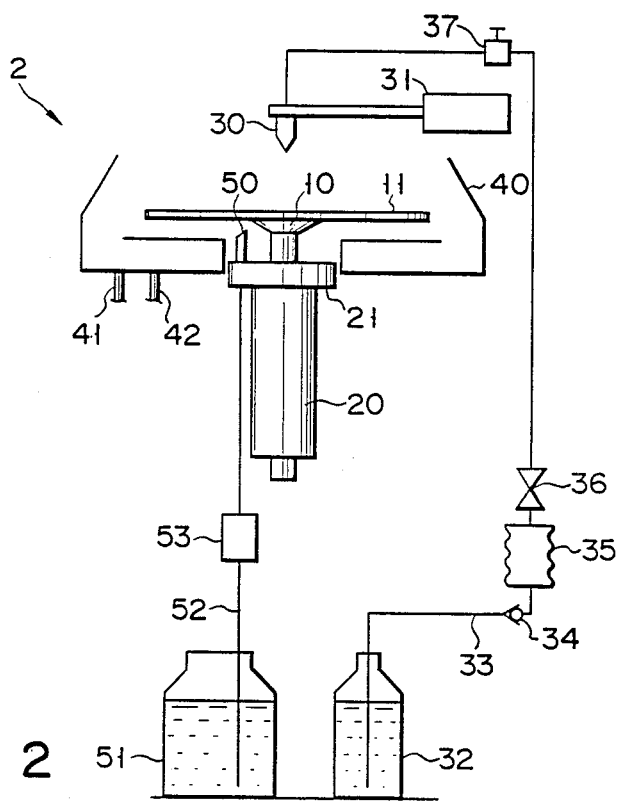
F I G. 2

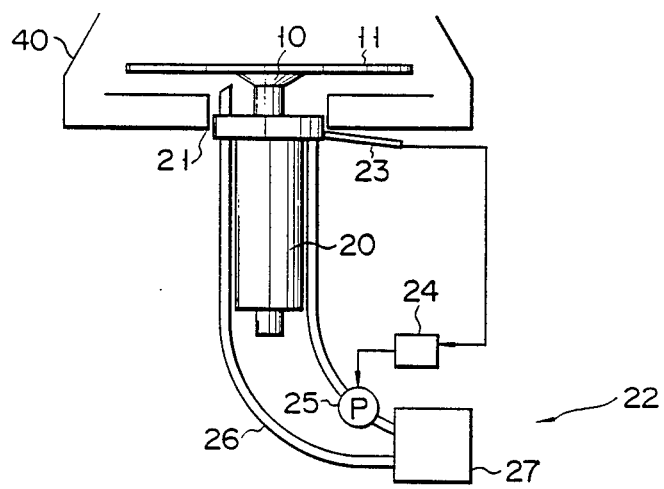
F I G. 3
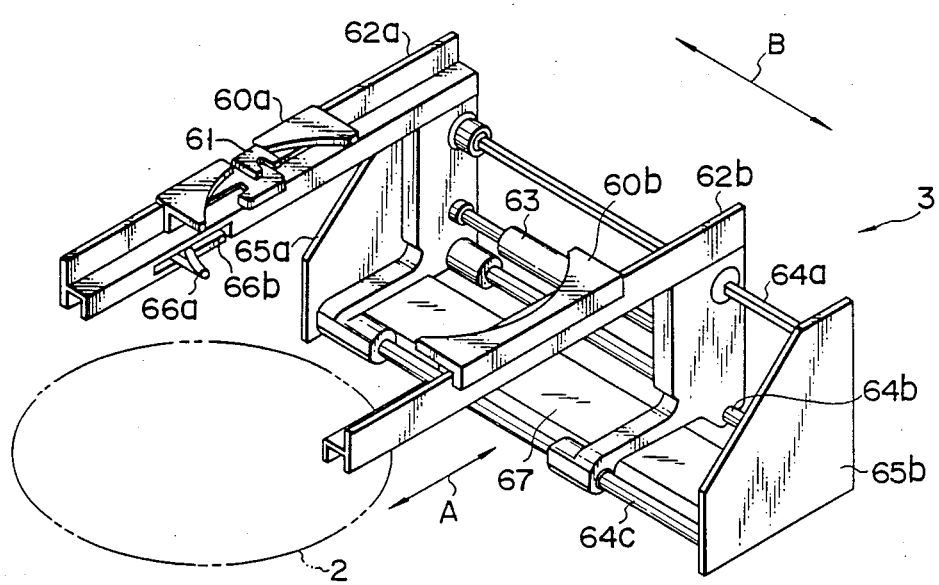
F I G. 4

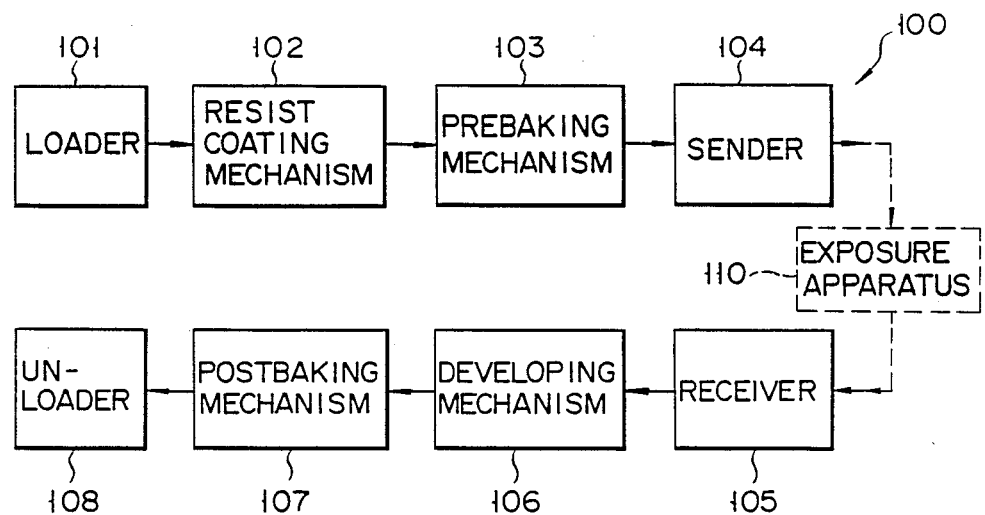
F I G. 6
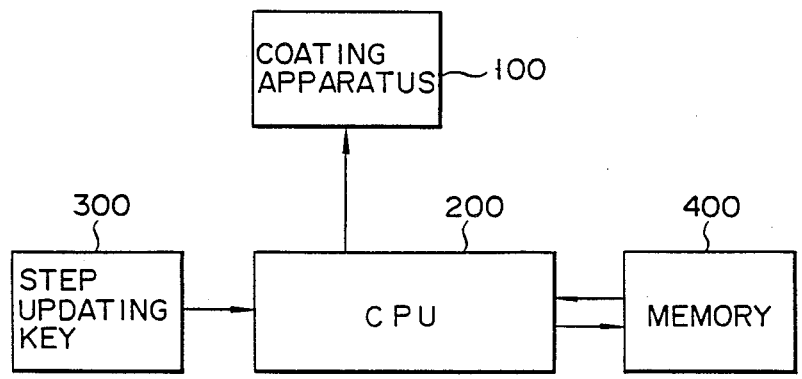
F I G. 7

AUTOMATIC COATING SYSTEM

BACKGROUND OF THE INVENTION

1. Field of the Invention

The present invention relates to an automatic coating system for automatically coating a coating material on an object to be coated.

2. Description of the Related Art

The manufacture of semiconductors includes a step of coating a resist on a wafer. This step is executed by use of the apparatus disclosed in Japanese Patent Publication No. 53-37189, for example. According to this reference, a wafer is mounted on a spinning head arranged in a processing vessel and is temporarily secured on the spinning head by suction. In this condition, a resist solution is supplied on the surface of the wafer while simultaneously rotating the wafer.

In this apparatus, a series of coating operations to be executed are programmed beforehand in a program unit, and the programmed steps are sequentially, successively performed to coat a coating material on a wafer. That is, resist coating is performed by the following series of steps. First, a wafer conveyed by a conveyor apparatus is centered on a spinning head and temporary chucked on the head by vacuum suction, and a cup is set to prevent scattering of a resist solution. Thereafter, while the head is rotated, the resist solution is dropped and a coating operation is performed. In this case, since the resist solution or the like adheres on the rear surface of the wafer upon resist coating, the adhered material must be removed in the coating apparatus before it is brought into contact with the conveyor apparatus. For this purpose, a cleaning nozzle is arranged to clean the wafer rear surface. After the resist is coated, a cleaning solution is injected from the cleaning nozzle to the rear surface of the wafer while the wafer is rotated, thereby cleaning the wafer rear surface.

In such a conventional apparatus, the above series of operations of coating a resist solution on a wafer can be successively executed without any problem. However, if it is required that the apparatus be adjusted or checked for maintaining a desirable condition, the apparatus must be stopped for some time, with the step executed by the apparatus kept in a suspended condition.

In the conventional coating apparatus, however, an operation cannot be stopped during the coating steps. Therefore, in order to stop the operation to perform adjustment, a power source must be turned off. As a result, when adjustment is to be performed while properness of the operation is checked in each step, an operability becomes very poor, and a long time is required for the adjustment, resulting in a cumbersome operation for an operator.

Summary of the Invention

The present invention has been made in order to eliminate the above drawback of the conventional technique and has as its object to provide an automatic coating system in which adjustment and maintenance of an apparatus can be easily performed upon coating of a coating material.

An automatic system according to the present invention comprises a coating means for coating a coating material on an object to be coated in accordance with a coating operation including a plurality of steps; an input means for inputting a signal for operating a preset series of steps one by one; and an operation starting means for starting one step when the signal is input.

According to the present invention, the first step of the coating operation is performed only when the input means is operated, and the next step is not performed until the input means has received the next operation. Therefore, it can be checked whether or not a proper operation is performed in each step and the operation of each step can be adjusted after the step is finished while the operation of the coating apparatus is stopped. In addition, with an updating input from the input means, the respective steps can be sequentially performed without switching off the coating apparatus. Therefore, adjustment of the coating operation and maintenance of the coating apparatus are facilitated.

BRIEF DESCRIPTION OF THE DRAWINGS

FIG. 1 is a block diagram showing an automatic coating system according to an embodiment of the present invention;

FIG. 2 is a schematic view showing an arrangement of a coating apparatus adopted in the coating system shown in FIG. 1;

FIG. 3 is a schematic view showing a cooling mechanism for cooling a flange of a motor of the coating apparatus;

FIG. 4 is a perspective view showing a conveyor apparatus used in the coating system shown in FIG. 1;

FIG. 6 is a block diagram showing a coating apparatus adopted in another embodiment of the present invention;

FIG. 7 is a block diagram showing an automatic coating system which employs the coating apparatus shown in FIG. 6.

DETAILED DESCRIPTION OF THE PREFERRED EMBODIMENTS

Figure 5A:
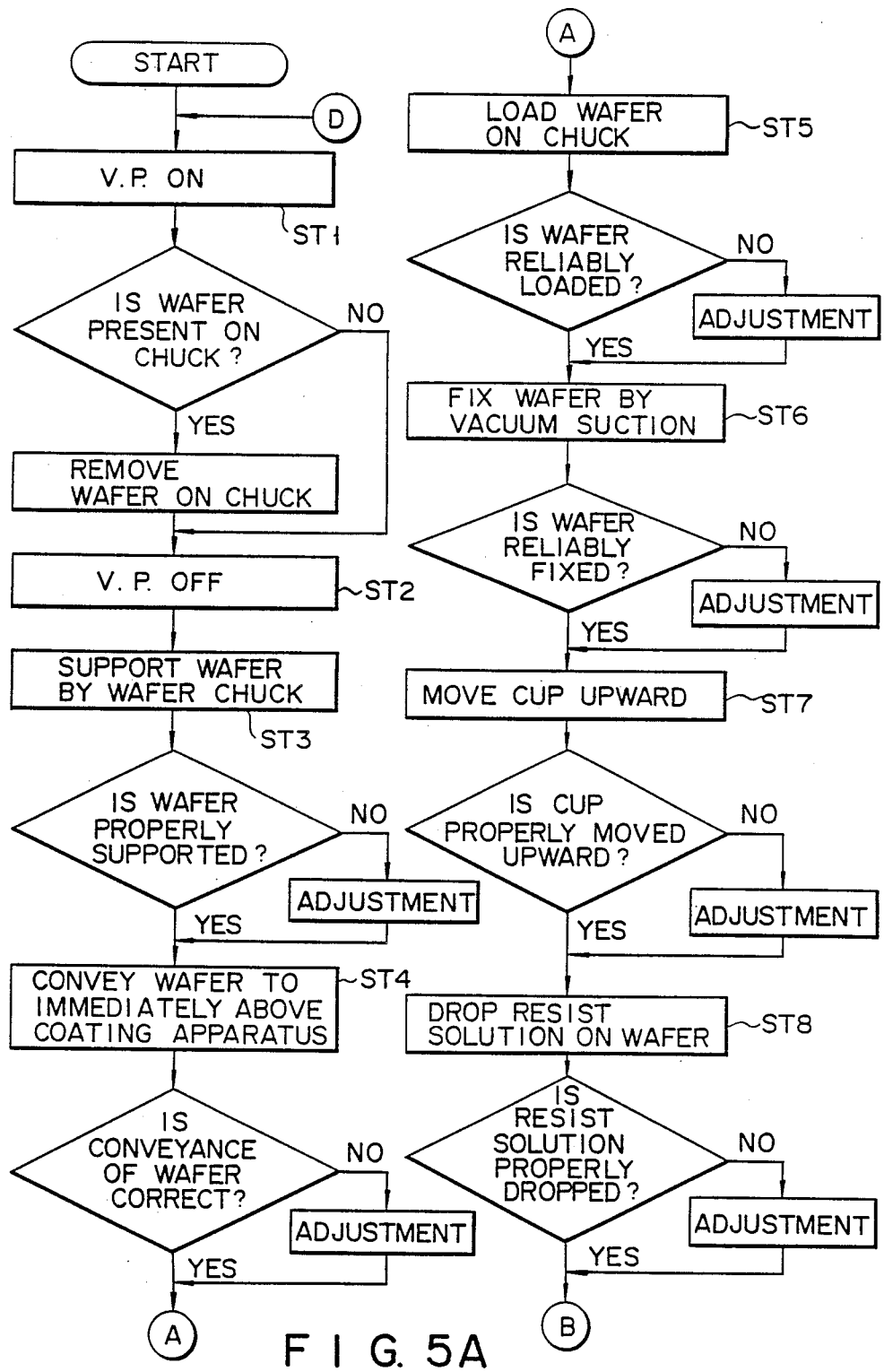
FIGS. 5A and 5B are flow charts showing operations of the coating system shown in FIG. 1.

Embodiments of the present invention will be described in detail below with reference to the accompanying drawings.

FIG. 1 is a block diagram showing a resist coating system for a semiconductor wafer according to an embodiment of the present invention. Referring to FIG. 1, reference numeral 1 denotes a CPU (Central Processing Unit) for controlling an operation of the resist coating system according to this embodiment. CPU 1 is connected to coating apparatus 2 for coating a resist on a wafer, conveyor apparatus 3 for conveying a wafer to coating apparatus 2, step updating key 4 as an input means for inputting a signal for operating a programmed series of coating steps one by one, memory 5 for storing operation programs for conveyor apparatus 3, and recipe controller 6 for editing and storing operation programs for coating apparatus 2.

Coating apparatus 2 is arranged as shown in FIG. 2. Spinning chuck 10 is for supporting semiconductor wafer 11 by vacuum suction and rotated by motor 20. Vacuum suction of wafer 11 is performed by activating a vacuum pump (not shown). Motor 20 is a high-performance motor having high acceleration, and flange 21 is formed on the upper portion of motor 20. Flange 21 of motor 20 is fixed to a housing (not shown) of the coating apparatus.

As shown in FIG. 3, the heat of motor 20 can be prevented from being conducted upward by adjusting the temperature of flange 21 by temperature adjusting unit 22. Unit 22 supplies a signal from thermocouple 23 to control unit 24. When the temperature detected by thermocouple 23 exceeds a predetermined value, unit 22 activates pump 25 to flow circulating water from tank 27 into flange 21 through pipe 26 so that flange 21 is cooled and the temperature is adjusted.

Resist nozzle 30 is located above wafer 11 supported on chuck 10 and drops a resist solution substantially on the center of wafer 11. Nozzle 30 can be horizontally pivoted by scanner 31. Therefore, if, for example, dispense of the resist solution is not performed from nozzle 30 for a certain period of time at an interval between lots, nozzle 30 is pivoted by scanner 31 to a position outside wafer 11 t perform dummy dispense. As a result, since the resist solution is not in contact with air for a long time at the distal end of the nozzle, solidification of the resist solution can be prevented.

The resist solution is accommodated in resist solution vessel 32, supplied to nozzle 30 through pipe 33 upon activation of pump 35, and dispensed from the distal end of nozzle 30. Along pipe 33, check valve 34 is located between vessel 32 and pump 35, and valve 36 to be opened/closed in association with pump 35 and suck-back valve 37 for sucking back the resist solution exposed from the distal end of nozzle 30 by surface tension are located between pump 35 and nozzle 30.

Cup 40 is located to surround chuck 10 and prevents scattering out of the resist solution from the coating apparatus when the resist solution is coated Cup 40 can be vertically moved by a lifting apparatus (not shown). When the resist solution is to be coated, cup 40 is located at a position shown in FIG. 2, and when wafer 11 is to be loaded/unloaded, it is moved downward. The lower surface of cup 40 is connected to drain tube 41 and exhaust tube 42.

Cleaning nozzle 50 extends from the upper surface of flange 21 so that its longitudinal direction is vertical. A cleaning solution (e.g., an arbitrary solvent) is injected from nozzle 50 toward the rear surface of wafer 11, thereby cleaning the rear surface of wafer 11. A cleaning solution injection end of nozzle 50 is inclined toward the circumferential surface of wafer 11 so that not only the rear surface but also the circumferential surface of wafer 11 can be cleaned. As FIG. 2 demonstrates, the diameter of chuck 10 is considerably smaller than the diameter of wafer 11. This fact allows the lower surface of the wafer 11 to be washed. The solvent is accommodated in solvent vessel 51. When pump 53 is driven, the contained solvent is supplied to nozzle 50 through pipe 52 and injected from the distal end of nozzle 50.

Conveyor apparatus 3 is located above coating apparatus 2 and arranged as shown in FIG. 4. A pair of wafer chucks 60a and 60b are for clamping a wafer, and an arcuated recess corresponding to the outer circumference of a wafer is formed in each chuck. Chuck 60a has clamper 61 for clamping a wafer. Chucks 60a and 60b are movably supported by supports 62a and 62b, respectively, and driven in an arrow A direction by a motor and a belt (not shown). Each of supports 62a and 62b is movably supported by support rods 64a, 64b and 64c and driven in an arrow B direction by air cylinder 63. Therefore, the interval between supports 62a and 62b can be arbitrarily adjusted in accordance with the size of a wafer to be conveyed. Both ends of each of rods 64a, 64b and 64c are fixed to side plates 65a and 65b which are connected with each other by bottom plate 67.

Wafer stop pin 66a projects from a portion near the distal end of support 62a and defines a convey position of a wafer. Pin 66a can be moved along groove 66b by an air cylinder (not shown) located inside support 62a. The position of pin 66a is set such that a wafer is stopped at a position immediately above the chuck of the coating apparatus.

Conveyor apparatus 3 includes a lifting apparatus (not shown) located below bottom plate 67. Therefore, a wafer conveyed along supports 60a and 60b can be moved downward and placed on chuck 10 of coating apparatus 2.

In conveyor apparatus 3, a conveyed wafer is supported by chucks 60a and 60b, and chucks 60a and 60b are moved along supports 62a and 62b, thereby conveying the wafer. When the wafer abuts against pin 66a, conveyance is stopped, and the wafer is moved downward and placed on chuck 10.

As described above, memory 5 stores the operation programs of conveyor apparatus 3. In this embodiment, the operation programs of apparatus 3 require no modification at a user side and are stored in memory 5.

Recipe controller 6 includes a keyboard and a display and can edit the operation programs of coating apparatus 2. Controller 6 also includes a recipe module store as a non-volatile memory capable of storing programs. Edited programs are stored in this module store.

CPU 1 allows conveyor apparatus 3 and coating apparatus 2 to properly perform the series of steps on the basis of the programs stored in memory 5 and recipe controller 6 and signals supplied from step updating key 4.

Key 4 is not operated while each step is being executed but is operated when one step is completed and the next one is to be executed. That is, CPU 1 controls the coating operation such that only one step of the programmed series of steps is performed each time key 4 is operated and that after this step is finished the next step is not executed until key 4 is operated. Therefore, adjustment and maintenance of the apparatuses can be easily performed between the steps.

Figure 5B:
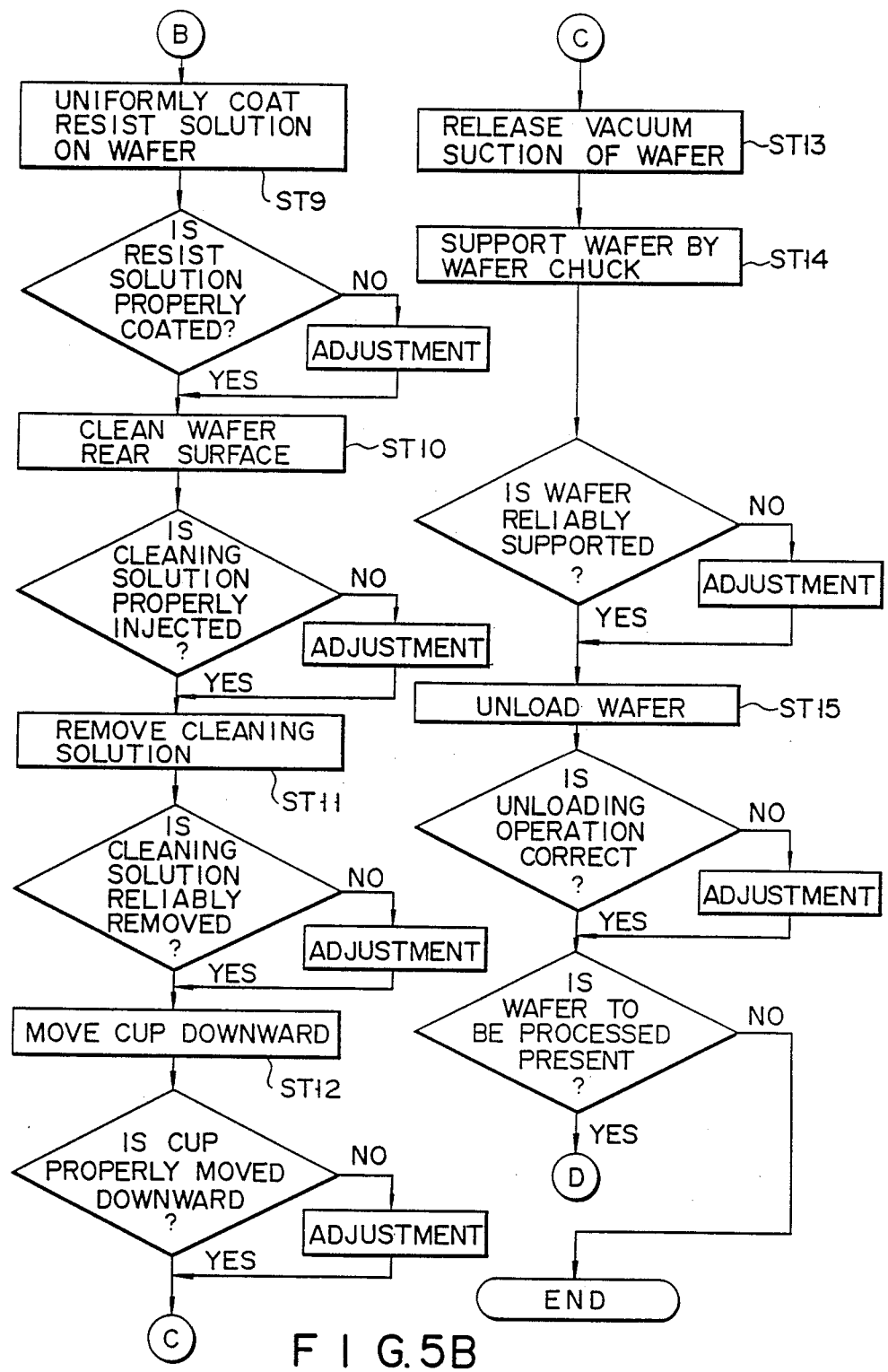

An operation of the coating system having the above arrangement will be described below with reference to FIGS. 5A and 5B.

A vacuum pump is activated so that chuck 10 of coating apparatus 2 chucks wafer 11 by vacuum suction (STEP 1). In this case, a vacuum sensor detects whether wafer 11 is present on chuck 10. If a wafer is present, this wafer is removed.

The vacuum pump is stopped (STEP 2).

The wafer is clamped by chucks 60a and 60b and centered (STEP 3). After this step, it is determined by using a sensor (not shown) whether or not the wafer is properly supported, i.e., support of the wafer is reliable and whether a centering position is correct. If the wafer is not properly set, apparatus 3 is adjusted.

The wafer supported by chucks 60a and 60b is conveyed, and when the wafer abuts against pin 66a, the conveyor belt is stopped (STEP 4). Thereafter, it is determined by using a sensor (not shown) whether or not a position of the conveyed wafer is correct. If the position is not correct, apparatus 3 is adjusted.

Chucks 60a and 60b are moved downward, and the wafer is loaded on chuck 10 of coating apparatus 2 (STEP 5). In this case, cup 40 is moved downward so as not to interfere with wafer loading. Thereafter, it is determined by using a sensor (not shown) whether or not the wafer is reliably placed on chuck 10. If the loading state is not correct, apparatus 3 is adjusted.

The vacuum pump is activated to fix the wafer on chuck 10 by vacuum suction (STEP 6). Thereafter, it is determined by using a vacuum sensor (not shown) whether or not the wafer is reliably fixed on the chuck. If fixing is unsatisfactory, the vacuum system is adjusted.

Cup 40 is moved upward to a predetermined position (STEP 7). Thereafter, it is determined by using a sensor (not shown) whether or not a position of cup 40 is correct. If the position is offset, the lifting apparatus is adjusted.

STEPs 1 to 7 for the above loading operation can be executed step by step by manually selecting an appropriate button; alternatively, they can be executed automatically by the automatic button selection based on the program stored in memory 5. Thereafter, a series of resist coating steps are performed on the basis of the programs stored in recipe controller 6 by a user.

While motor 20 is driven to rotate the wafer at, e.g., a rotation speed of 1,000 rpm and an acceleration of 10 Krpm/sec and valves 36 and 37 are opened, STEP 8 is performed as follows: Bellows pump 35 is driven to drop a resist solution from resist nozzle 30 to substantially the center of the wafer surface. If desired, the resist solution can be coated on the wafer by moving resist nozzle 30 to the region above the center of the wafer, dropping the resist solution to the center of the wafer, and then rotating the wafer at a high speed. A time required for this step is, e.g., three seconds. Thereafter, it is determined whether or not the resist solution is correctly dropped. If the resist solution is not correctly dropped, the resist solution supply system is adjusted. Note that when the rotation speed of chuck 10 is set, a servo system (not shown) can be adjusted to match the rotation speeds.

The rotation speed and acceleration of the wafer are set at 4,000 rpm and 10 Krpm/sec, respectively, to expand the resist solution, thereby coating the resist solution on the wafer surface to a uniform thickness by a centrifugal force (STEP 9). In this case, the resist solution components scattered outside the wafer by the centrifugal force are collected to the bottom of cup 40 and drained from drain tube 41. After coating, it is determined whether or not coating is properly performed. If the resist solution is not uniformly coated, the apparatus is adjusted.

The rear surface of the wafer contaminated in the above resist solution coating step is cleaned by a cleaning solution (STEP 10). In this step, while the wafer is rotated at the rotation speed of 2,000 rpm and the acceleration of 10 Krpm/sec, an arbitrary solvent as a cleaning solution is sprayed from cleaning nozzle 50 to the wafer rear surface. A time required for this step is, e.g., ten seconds. Since nozzle 50 is fixed to mounting flange 21 of motor 20, by only adjusting a relative positional relationship between nozzle 50 and the wafer once, a reliable cleaning effect can always be assured. If an injection pressure of the cleaning solution is low as when injection is started or finished, the cleaning solution may be immediately dropped from nozzle 50 to a portion near the proximal end of nozzle 50. If the dropped cleaning solution is left there, it may enter into motor 20. In order to prevent this, drain tubes (not shown) are preferably located around nozzle 50 to drain the cleaning solution. After this step, it is determined whether or not the wafer rear surface is properly cleaned. If the wafer is not properly cleaned, the cleaning solution supply system is adjusted.

The wafer is rotated at the rotation speed of 2,000 rpm and the acceleration of 10 Krpm/sec to scatter and remove the cleaning solution therefrom (STEP 11). Thereafter, it is checked whether or not this step is correctly performed. If the step is not correctly performed, the apparatus is adjusted.

Cup 40 is moved downward to a predetermined position (STEP 12). Thereafter, it is determined by using a sensor (not shown) whether or not cup 40 is moved downward to a correct position. If the position is offset, the lifting apparatus is adjusted.

The vacuum pump is switched off to release fixing of the wafer to chuck 10 by vacuum suction (STEP 13).

The wafer is clamped by chucks 60a and 60b (STEP 14). In this case, it is determined by using a sensor (not shown) whether or not the wafer is properly clamped. If the wafer is not properly clamped, conveyor apparatus 3 is adjusted.

Thereafter, the wafer is unloaded from coating apparatus 2 in an entirely reverse order of the above wafer loading operation (STEP 15). Also in this case, it is determined whether or not the unloading operation is correctly performed. If the operation is not correctly performed, apparatus 3 is adjusted.

In this manner, the series of steps for coating a resist on one wafer are completed, and these steps are repeatedly executed as long as a wafer to be processed is present.

As described above, after each step is finished, key 4 is operated to start the next step, and the apparatuses are set in a ready state until key 4 is operated. That is, when key 4 is initially operated, a signal is supplied to CPU 1. CPU 1 controls conveyor apparatus 3 such that only the first step of the series of steps, i.e., STEP 1 is performed. Even when STEP 1 is finished, the next step is not started because CPU 1 does not output a signal for starting the next step unless key 4 is operated. Each following step is performed each time key 4 is operated. Therefore, the apparatuses can be adjusted and the properness of the operation can be checked between the steps. In the above embodiment, in most cases, after each step is finished, it is checked whether or not the operation is properly performed. These checks, however, may be performed only when needed. In an actual operation after adjustment and maintenance of the apparatuses are finished, the operation checks may be omitted.

Note that in each of STEPs 8 to 11, a dispense signal for the resist solution or cleaning solution can be input any number of times. In this case, the dispense signal may be repeatedly input a plurality of times while the wafer is rotated, thereby precisely adjusting the pump, the valve and the like.

In the above embodiment, the number of steps is merely an example. Therefore, each step may be divided into substeps, or several steps can be combined into a single step. Further, one step can be executed repeatedly, and a series of several steps can be executed repeatedly.

Another embodiment of the present invention will be described below. In this embodiment, as shown in FIG. 6, the present invention is applied to a coating apparatus for performing a series of processes from resist coating to development. Referring to FIG. 6, coating apparatus 100 comprises loader 101 for picking up a wafer from a wafer cassette (not shown) and loading the wafer, resist coating mechanism 102 for coating a resist on the wafer, prebaking mechanism 103 for heating/evaporating a residual solvent in the coated resist, sender 104 for conveying the wafer to exposure apparatus 110 outside the coating apparatus, receiver 105 for receiving the wafer processed by exposure apparatus 110, developing mechanism 106 for coating a developing agent on the wafer to form a resist pattern, postbaking mechanism 107 for enhancing adhesion properties between the wafer and the resist, and unloader 108 for storing the processed wafer in a wafer cassette (not shown). Mechanisms from loader 101 to sender 104 and those from receiver 105 to unloader 108 are arranged in tandem with each other, respectively, and these two series are parallelly arranged. Wafers are conveyed between the respective mechanisms by a belt conveyor mechanism.

The arrangement of loader 101 is basically similar to that of conveyor apparatus 3. Sender 104, receiver 105 and unloader 108 have the same arrangement as that of loader 101.

Resist coating mechanism 102 includes a coating apparatus basically similar to that used in the first embodiment. A wafer is loaded on a wafer table (chuck) of the coating apparatus by loader 101.

Prebaking and postbaking mechanisms 103 and 104 need only be a mechanism capable of heating a wafer to a proper temperature. For example, an oven can be used as the mechanism.

As a developing apparatus used in developing mechanism 106, an apparatus capable of developing by a spinning method can be used. In this case, an apparatus similar to the resist coating apparatus is used. That is, a wafer is fixed on a rotary chuck, and a developing agent is dropped on the wafer while the wafer is rotated at high speed, thereby coating the developing agent on the wafer surface.

The coating system comprising coating apparatus 100 as described above is arranged as shown in FIG. 7. In the coating system of this embodiment, as in the coating system in the first embodiment, each following step is not started unless a step updating key is operated.

CPU 200 is connected to coating apparatus 100, step updating key 300 and memory 400 and controls the entire coating system. Memory 400 stores operation programs for a series of steps performed by the respective mechanisms. Memory 400 can edit the operation programs for coating apparatus 100. When key 300 is operated, a signal is supplied to CPU 200. CPU 200 outputs an operation signal to coating apparatus 100 on the basis of the operation programs stored in memory 400. In this case, similar to CPU 1 in the first embodiment, CPU 200 controls coating apparatus 100 such that apparatus 100 performs only one step of the programmed series of steps each time key 300 is operated and after this step is finished, apparatus 100 does not perform the next step until key 300 is operated again.

In such a coating system, the number of types of semiconductor wafers to be processed is very large. Therefore, in this embodiment, an apparatus for storing processing conditions corresponding to each type of wafer is employed, and processing conditions corresponding to a wafer loaded in coating apparatus 100 are read out from the memory apparatus, thereby controlling the processing steps performed by the respective mechanisms of apparatus 100 on the basis of the readout processing conditions.

More specifically, an identification indication symbol formed at a predetermined position of a wafer, e.g., an ID mark formed of letters, numerals, bar codes and the like and the processing conditions of the mechanisms of coating apparatus 100 are stored in memory 400, and CPU 200 controls the operation of each mechanism of apparatus 100 on the basis of information read out from memory 400. In this case, for example, if a wafer is present in loader 101, a reading apparatus (not shown) reads the identification indication symbol of the wafer and outputs a signal representing the read symbol to CPU 200. Although the processing conditions may be stored in memory 400 in units of wafers to be processed, they are preferably stored in units of types of wafers. As a result, a memory capacity can be decreased.

In a processing condition storage portion of memory 400, data areas for wafers are formed in correspondence with the identification indication symbols (ID marks). The conditions of the respective processing mechanisms in apparatus 100 are stored in the same address of each data area.

In such a coating system, when a wafer conveyed in resist coating mechanism 102 is designated to be processed under processing conditions for wafers of a certain type, the processing conditions are read out by CPU 200. CPU 200 outputs the processing conditions corresponding to the wafer and executes coating processing under these conditions. After the resist coating processing, if key 300 is operated, the wafer is conveyed to prebaking mechanism 103 for the next step. In this case, CPU 200 outputs a signal so that processing is performed under the processing conditions corresponding to the wafer processed by resist coating mechanism 102. The similar operation is repeatedly performed in the following processing mechanisms. It is a matter of course that the mechanisms can be adjusted after each step is finished and before key 300 is operated to start the next step.

Reading of the identification indication symbol of a wafer need not be performed in loader 101 but may be performed in any other mechanism.

Figure 8:
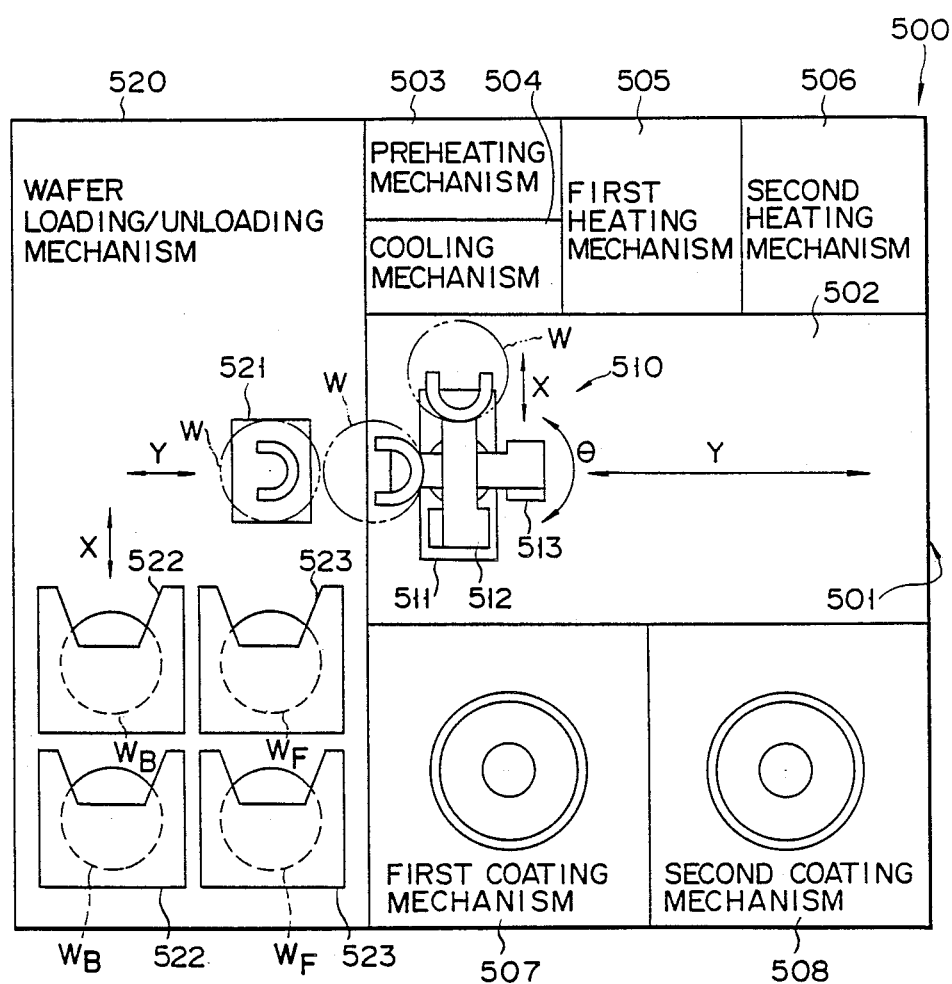
FIG. 8 is a schematic view showing an arrangement of a coating apparatus adopted in still another embodiment of the present invention.

The present invention can be applied to a coating apparatus described in Japanese Patent application No. sho 63-30219 (application date: Feb. 12, 1988, inventor: Mitsuru USHIJIMA). An embodiment of an automatic coating system using apparatus 500 which is described in Japanese Patent application No. sho 63-30219 will be described below with reference to FIG. 8. Path 502 extends in an arrow Y direction (transverse direction) at a central portion of base 501. Preheating mechanism 503, cooling mechanism 504 and first and second heating mechanisms 505 and 506 are located at one side of path 502, and first and second coating mechanisms 507 and 508 are located at its other side. Cooling mechanism 504 is located below preheating mechanism 503.

Wafer conveyor apparatus 510 is located in and moves along path 502. Apparatus 510 comprises main body 511 and two wafer chucking tweezers 512 and 513. Tweezers 512 and 513 are vertically disposed and can independently move in Y (transverse), X (longitudinal), Z (vertical) and $\theta$ (rotational) directions. Main body 511 of conveyor apparatus 510 is also rotatably arranged. Tweezers 512 and 513 and main body 511 of apparatus 510 are rotated by a rotary drive mechanism comprising a stepping motor and a ball screw coupled to the motor. Apparatus 510 conveys wafer W to the respective mechanisms described above.

Wafer loader/unloader mechanism 520 is located at the side of base 501. Mechanism 520 comprises wafer cassette 522 housing semiconductor wafers $W_B$ before processing and wafer cassette 523 housing wafers $W_F$ after processing. Mechanism 520 also includes tweezer 521 which can move in the X and Y directions and chucks wafer W. Tweezer 521 takes out wafers before processing from cassette 522, and receives those after processing from the tweezers of wafer conveyor apparatus 510. At an interface between path 502 and loader-/unloader mechanism 520, wafer W can be exchanged between tweezers 512 and 513 of conveyor apparatus 510 and tweezer 521 of loader/unloader mechanism 520.

Tweezers 512 and 513 of conveyor apparatus 510 can exchange wafer W with an arbitrary one of the respective processing mechanisms (503 to 508).

In the coating system of this embodiment, coating apparatus 500 having the above arrangement can be basically controlled by the same control system as the system shown in FIG. 7.

The operation of the coating system having above coating apparatus 500 will be described below. This operation is basically performed on the basis of the programs stored in a memory unit. One of wafers is taken out from cassette 522 by tweezer 521 of loader-/unloader mechanism 520 and conveyed close to conveyor apparatus 510 standing by at the left end of path 502. One tweezer of apparatus 510, e.g., tweezer 512 is moved to receive wafer W chucked by tweezer 521. In this case, as in the above embodiment, the ID code indicated on the wafer is read to select programs of manufacturing steps corresponding to the wafer.

For example, tweezer 512 which has received wafer W is moved toward preheating mechanism 503, and wafer W is set and preheated in mechanism 503. In this case, tweezer 521 is moved to pick up the next wafer from cassette 522 and kept at a ready position near the interface between loader/unloader mechanism 520 and path 502. When loading of the first wafer to preheating mechanism 503 is finished, the next wafer at the ready position is received by tweezer 512. After the ID code is read and the wafer is confirmed to be of the same type as the first wafer, the wafer is kept on tweezer 512.

When preheating is finished, conveyor apparatus 510 is operated to rotate and move tweezer 513, thereby picking up the preheated wafer from preheating mechanism 503. The wafer before processing chucked by tweezer 512 is set in preheating mechanism 503, and at the same time tweezer 513 is moved downward and further moved to set the preheated wafer in cooling mechanism 504. At this time, a wafer to be processed next is located at the ready position of the interface between loader/unloader mechanism 520 and path 502 by tweezer 521.

Conveyor apparatus 510 is operated so that tweezer 512 receives the wafer before processing and stands by. After the cooling step is finished, the wafer in cooling mechanism 504 is taken out by tweezer 513 of apparatus 510 and conveyed to a photoresist coating step programmed next. This step is performed by, e.g., first coating mechanism 507. If preheating of the wafer is finished during this coating processing, the preheated wafer is taken out from preheating mechanism 503 and set in cooling mechanism 504 by tweezer 513.

When the coating operation of the wafer set in first coating mechanism 507 is finished, the wafer is taken out from mechanism 507 by tweezer 513, and tweezer 513 is moved along the Y direction, thereby setting the wafer in first heating mechanism 505 to perform heating. During this processing, since cooling of the wafer in cooling mechanism 504 is finished, the wafer in mechanism 504 is taken out by tweezer 513 and set in first coating mechanism 507 to start coating. Such a series of processing operations are continuously performed until no wafer is left in the cassette.

Note that two wafers can be simultaneously processed in an identical process by using second heating mechanism 506 and second coating mechanism 508.

Also in this coating system, a series of operations are programmed in the memory in units of an arbitrary number of steps, and each following step is not started unless the step updating key is operated. Therefore, as in the above embodiments, adjustment of the apparatus and the like can be performed between the respective steps.

In this embodiment, conveyor apparatus 510 of coating apparatus 500 has two tweezers, and the two tweezers can operate independently of each other. Therefore, a degree of freedom of the processing is high enough to eliminate a drawback in that if a wafer is present in a mechanism of the next step, a wafer in a current step cannot be replaced. Also, in such a coating apparatus, conveyor apparatus 510 can freely move along path 502, and the respective processing mechanisms are located at the both sides of the path. Therefore, an order of the processing steps can be arbitrarily selected, resulting in a very high degree of freedom of the operation programs. As a result, the system can immediately respond to an arbitrary processing step and can flexibly respond to a change in process. That is, processing programs best suited to a wafer to be processed can be selected. Note that the number of the tweezers of conveyor apparatus 510 need not be two but may be one or three or more.

If an arrangement is changed such that the second coating mechanism of the above coating apparatus is used as a developing mechanism and a wafer can be exchanged with an exposure apparatus at the right end of path 502, a coating apparatus capable of performing a series of operations from resist coating to development can be realized.

The present invention is not limited to the above embodiments but can be variously modified without departing from the spirit and scope of the present invention. For example, in the above embodiments, the present invention is applied to a resist coating system for a semiconductor wafer. The present invention, however, can be applied to various coating systems such as a resist coating system for a mask, a magnetic disk coated with a magnetic coating material, and a coating system for a magnetic tape.

What is claimed is:

1. An automatic coating system, comprising:
    coating means for coating a coating material on an object to be coated in accordance with a coating operation which includes a plurality of steps;
    input means for manually inputting a signal for operating a single step of said plurality of steps;
    operation starting means for starting said single step when the signal is input; and
    operation stopping means for automatically stopping the coating operation when the step is finished.

2. A system according to claim 1, further comprising memory means for storing processing conditions for various types of objects to be coated, and control means for controlling said coating means so that said coating means is operated at one of said processing conditions appropriate for the object to be coated, and executing the respective steps of said coating means on the basis of said one of said processing conditions.

3. A system according to claim 1, further comprising memory means for storing operation programs of said coating means.

4. A system according to claim 3, further comprising editing means for editing the operation programs of said coating means.

5. A system according to claim 1, further comprising:
   a chuck for affixing the object to be coated, said chuck having a diameter substantially smaller than the object to be coated.

6. A system according to claim 5, further comprising:
   spraying means for washing the circumferential and the lower surface of the object to be coated.

7. A system according to claim 1, wherein said coating means includes an object conveyor apparatus and a coating apparatus for coating a coating material on said object to be coated.

8. A system according to claim 7, wherein said coating apparatus includes fixing means for fixing said object to be coated, rotating means for rotating said object to be coated, and supplying means for supplying the coating material on the surface of said object to be coated.

9. A system according to claim 8, further comprising cleaning means for cleaning a rear surface of said object to be coated.

10. Automatic coating system, comprising:
    coating means for coating a coating material on an object to be coated in accordance with a coating operation which includes a plurality of steps;
    memory means for storing operation programs of a series of steps of said coating means;
    input means for manually inputting a signal for operating a single step of said plurality of steps; and
    a CPU for receiving the signal from said input means and allowing said coating means to start said step and to stop the coating operation when the step is finished, said CPU performing the series of steps on the basis of the programs stored in said inputting means by repeatedly operating said inputting means.

11. An automatic coating system, comprising:
    coating means for coating a coating material on an object to be coated in accordance with a coating operation which includes a plurality of steps;
    input means for manually inputting a signal for operating a single step of said plurality of steps;
    operation starting means for starting said single step when the signal is input; and
    operation stopping means for automatically stopping the coating operation when the step is finished;
    wherein said coating means includes a heating mechanism, coating mechanism, and a conveyor mechanism, said conveyor mechanism conveying said object along a path, and said heating and coating mechanisms being located on one side of said path.

12. A system according to claim 11, wherein said conveyor mechanism includes a plurality of object holding members.

13. A system according to claim 11, wherein said conveyor mechanism includes a plurality of object moving members.

* * * * *